US007812690B2

(12) United States Patent
Peyresoubes et al.

(10) Patent No.: US 7,812,690 B2
(45) Date of Patent: Oct. 12, 2010

(54) COMPACT POWER-AGILE FILTER, PARTICULARLY FOR RADIOCOMMUNICATION SYSTEM AMPLIFICATION MODULE

(75) Inventors: Georges Peyresoubes, Cholet (FR); Olivier Guillard, Vezins (FR); Patrice Richard, Courbevoie (FR)

(73) Assignee: Thales (FR)

( * ) Notice: Subject to any disclaimer, the term of this patent is extended or adjusted under 35 U.S.C. 154(b) by 29 days.

(21) Appl. No.: 11/862,988

(22) Filed: Sep. 27, 2007

(65) Prior Publication Data

US 2008/0174388 A1    Jul. 24, 2008

(30) Foreign Application Priority Data

Sep. 27, 2006   (FR) ................... 06 08477

(51) Int. Cl.
*H01P 1/10* (2006.01)
*H03H 7/00* (2006.01)
(52) U.S. Cl. .................... 333/174; 333/103; 333/164
(58) Field of Classification Search ............... 333/103, 333/164, 174; 331/177 V, 117 R, 175, 36 C
See application file for complete search history.

(56) References Cited

U.S. PATENT DOCUMENTS

| 5,625,325 | A | * | 4/1997 | Rotzoll et al. ............... 331/16 |
| 5,905,398 | A | * | 5/1999 | Todsen et al. ............... 327/337 |
| 6,150,901 | A | * | 11/2000 | Auken ........................ 333/174 |
| 6,211,745 | B1 | * | 4/2001 | Mucke et al. ............ 331/117 R |
| 6,388,532 | B1 | * | 5/2002 | Babcock ...................... 331/44 |
| 6,400,231 | B1 | * | 6/2002 | Leduc et al. ........... 331/116 FE |
| 6,438,012 | B1 | * | 8/2002 | Osaka et al. .................. 365/52 |
| 6,535,075 | B2 | * | 3/2003 | Frech et al. ................. 333/17.1 |
| 6,633,219 | B2 | * | 10/2003 | Marbach et al. ............. 336/177 |
| 6,760,575 | B2 | * | 7/2004 | Welland ...................... 455/260 |
| 6,778,022 | B1 | * | 8/2004 | Zhang et al. .................. 331/14 |
| 6,806,781 | B2 | * | 10/2004 | Bisanti et al. ............. 331/36 R |
| 7,102,465 | B2 | * | 9/2006 | Utsunomiya et al. ........ 333/174 |
| 7,109,810 | B2 | * | 9/2006 | Senthilkumar et al. ... 331/116 R |
| 7,183,880 | B2 | * | 2/2007 | Kamata et al. .............. 333/174 |
| 7,230,503 | B1 | * | 6/2007 | Huang ..................... 331/117 R |
| 7,259,643 | B2 | * | 8/2007 | Son et al. .................... 333/174 |

OTHER PUBLICATIONS

Entesari et al., "A Differential 4-Bit 6.5-10-GHz RF MEMS Tunable Filter", IEEE Transactions on Microwave Theory and Techniques, vol. 53, No. 3, Part 2, pp. 1103-1110 (2005) XP001225632.
Peterson, "GaAs Insertion Enhances SINCGARS RF Preselector", Tactical Communications Conference, vol. 1 Tactical Communications: Technology in Transition, Proceedings of the Fort Wayne, IN, USA, Apr. 28-30, pp. 133-137 (IEEE 1992) XP010066443.

* cited by examiner

*Primary Examiner*—Robert Pascal
*Assistant Examiner*—Kimberly E Glenn
(74) *Attorney, Agent, or Firm*—Lowe Hauptman Ham & Berner, LLP

(57) ABSTRACT

The invention relates to a compact power-agile filter. The filter is a capacitance-weight filter comprising two electromagnetically-coupled oscillating circuits. Each oscillating circuit comprises capacitance weights. Each capacitance weight is controlled by signals. The filter comprises at least one motherboard and one daughterboard which are physically separate. The daughterboard comprises the capacitance weights, the motherboard comprises all the oscillating circuits. In particular, the invention applies to the power filter included in a radiocommunication system amplification module. For example, the invention can be used by a radiocommunication system that can be programmed by software means adapting to a range of signals extending over a wide frequency band.

10 Claims, 3 Drawing Sheets

COMPACT POWER-AGILE FILTER, PARTICULARLY FOR RADIOCOMMUNICATION SYSTEM AMPLIFICATION MODULE

RELATED APPLICATIONS

The present application is based on, and claims priority from, French Application Number 06/08477, filed Sep. 27, 2006, the disclosure of which is hereby incorporated by reference herein in its entirety.

FIELD OF THE INVENTION

The invention relates to a compact power-agile filter. In particular, the invention applies to the power filter included in a radiocommunication system amplification module. For example, the invention can be used by a software-programmable radiocommunication system adapting to a range of signals extending over a wide frequency band (the extent of which covers several gigahertz). These so-called software modules can also be adapted more generally to numerous waveforms.

BACKGROUND OF THE INVENTION

The radiocommunication systems generally comprise an amplifier module connected between, on the one hand, a radiofrequency module and, on the other hand, an antenna system. The function of such a module is to amplify the wanted signal as well in transmission as in reception. More particularly, the amplified wanted signal transmitted via the antenna system must be powerful enough to reach the required range, occupied by a frequency band corresponding to the waveform employed to achieve the performance levels, particularly in terms of desired bit rate, while observing the necessary normative and regulatory constraints.

An amplifier module can mainly be broken down in signal power amplification devices and wanted signal filtering devices. The filtering devices must be adapted to wanted signals whose waveform occupies a particularly wide bandwidth. As an example, the radiocommunication software systems that employ frequency-evasion waveforms can send and/or receive in a frequency range from 30 MHz to 3 GHz (or the frequency band commonly designated by the acronym VHF, standing for Very High Frequency, and the frequency band commonly designated by the acronym UHF, standing for Ultra High Frequency). The filtering devices must consequently guarantee compatible operation of the frequency-evasion waveforms, namely compatibility of the tuning speed and mastery of the transmitted spectrum. The filters called agile filters can be used in particular to address this issue. Among the agile filters, there are capacitance-weight filters, also called tractable filters.

FIG. 1 is a circuit diagram of a capacitance-weight filter according to the state of the art. The filter comprises a main board 1. The main board 1 comprises an input E via which a signal to be filtered is received, and an output S to which a filtered signal is delivered. The main board 1 comprises two magnetically-coupled oscillating circuits. The main board 1 also comprises capacitance weights (in FIG. 1, eight capacitance weights for each oscillating circuit designated by the letters A to H). The number of capacitance weights is linked to the extent of the frequency band covered by the filter and the intrinsic frequency band of said filter. Each capacitance weight A ... H in FIG. 1 comprises a capacitor and a diode. Each capacitance weight is controlled by signals received from a management and control board 2. The management and control board 2 converts the commands that it receives on inputs $C_A \ldots C_H$ into commands for the capacitance weights A ... H. The management and control board 2 and the main board 1 are normally implemented on two separate and interconnected electronic boards.

The capacitance-weight filters according to the state of the art can be used to filter powerful signals (for example, of the order of 50 W), by being agile, selective and limiting the losses. However, the bulk of such filters is a problem. It is possible to limit the bulk of such a filter by using three-dimensional mounting technique. However, this workaround then introduces a significant additional cost. In practice, the design of such a filter is made more complex, the fabrication methods more costly (fabrication and mounting then being at least partly carried out manually), and debugging, if not difficult, at least difficult to reproduce from one filter to another. More generally, the problem raised is that of the miniaturization of this type of filter in an automated industrial environment without degrading the technical performance levels of such a filter. Therefore, there is a need to solve the problems described above.

SUMMARY OF THE INVENTION

One aim of the invention is to overcome the above-mentioned drawbacks. To this end, the subject of the invention is a capacitance-weight filter comprising two electromagnetically-coupled oscillating circuits. Each oscillating circuit comprises capacitance weights. Each capacitance weight is controlled by signals. The filter comprises at least one motherboard and one daughterboard which are physically separate. The daughterboard comprises the capacitance weights, the motherboard comprises all the oscillating circuits.

In one embodiment, the interface between the motherboard and the daughterboard is provided by a connector and a wiring for the radiofrequency signals. The connector makes it possible to convey the commands intended for the capacitance weights. The wiring makes it possible to convey to the daughterboard radiofrequency signals received by the motherboard. The wiring makes it possible to convey from the daughterboard the filtered radiofrequency signals. The wiring can be produced by the end of the inductor using tap induction coils. Series inductors can be disposed on the motherboard over an area ensuring the magnetic coupling of the oscillating circuits, the capacitive part of which is included on the daughterboard. The inductors can, for example, be silvered wire air inductors.

Advantageously, the daughterboard is disposed roughly orthogonally to the motherboard. Furthermore, the daughterboard can comprise immobilizing elements disposed on the bottom part in contact with the motherboard, the immobilizing elements being introduced into opposing notches disposed on the motherboard.

The daughterboard, the motherboard and the connector can be manufactured using surface-mount component technology. The daughterboard can be a double-sided board.

In one embodiment, the motherboard is associated with several daughterboards.

The main advantages of the invention are that it makes it possible to guarantee a selectivity that is compatible with the technical, normative and regulatory requirements in cosite terms, while retaining the concepts of power and compactness. The invention is also consistent with the automatic production methods currently implemented, such as, for example, the so-called "surface-mount component" production lines.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF THE DRAWINGS

The present invention is illustrated by way of example, and not by limitation, in the figures of the accompanying drawings, wherein elements having the same reference numeral designations represent like elements throughout and wherein.

DETAILED DESCRIPTION OF THE DRAWINGS

Figure 1:
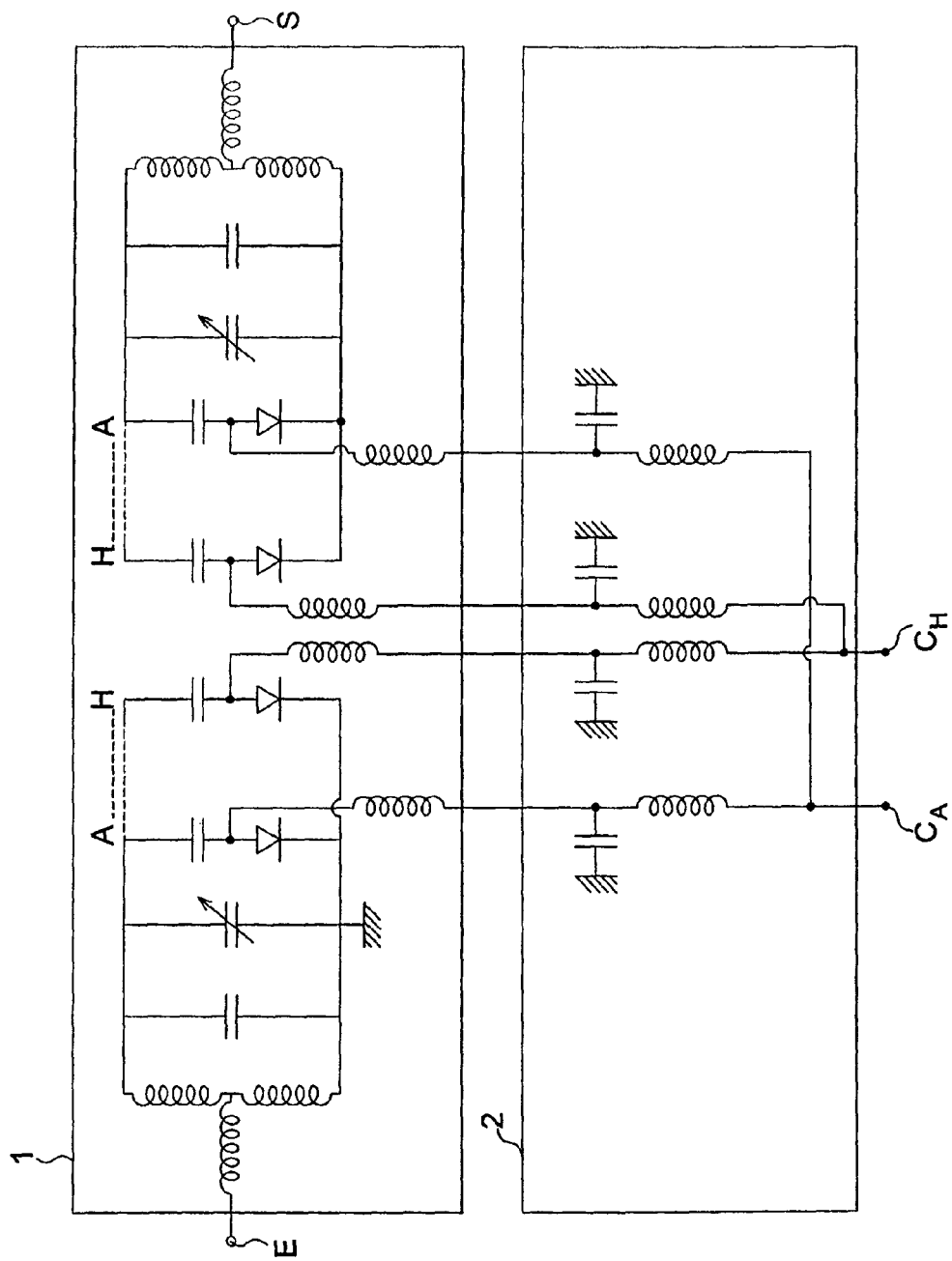
FIG. 1, a circuit diagram of a capacitance-weight filter according to the state of the art.
Figure 2:
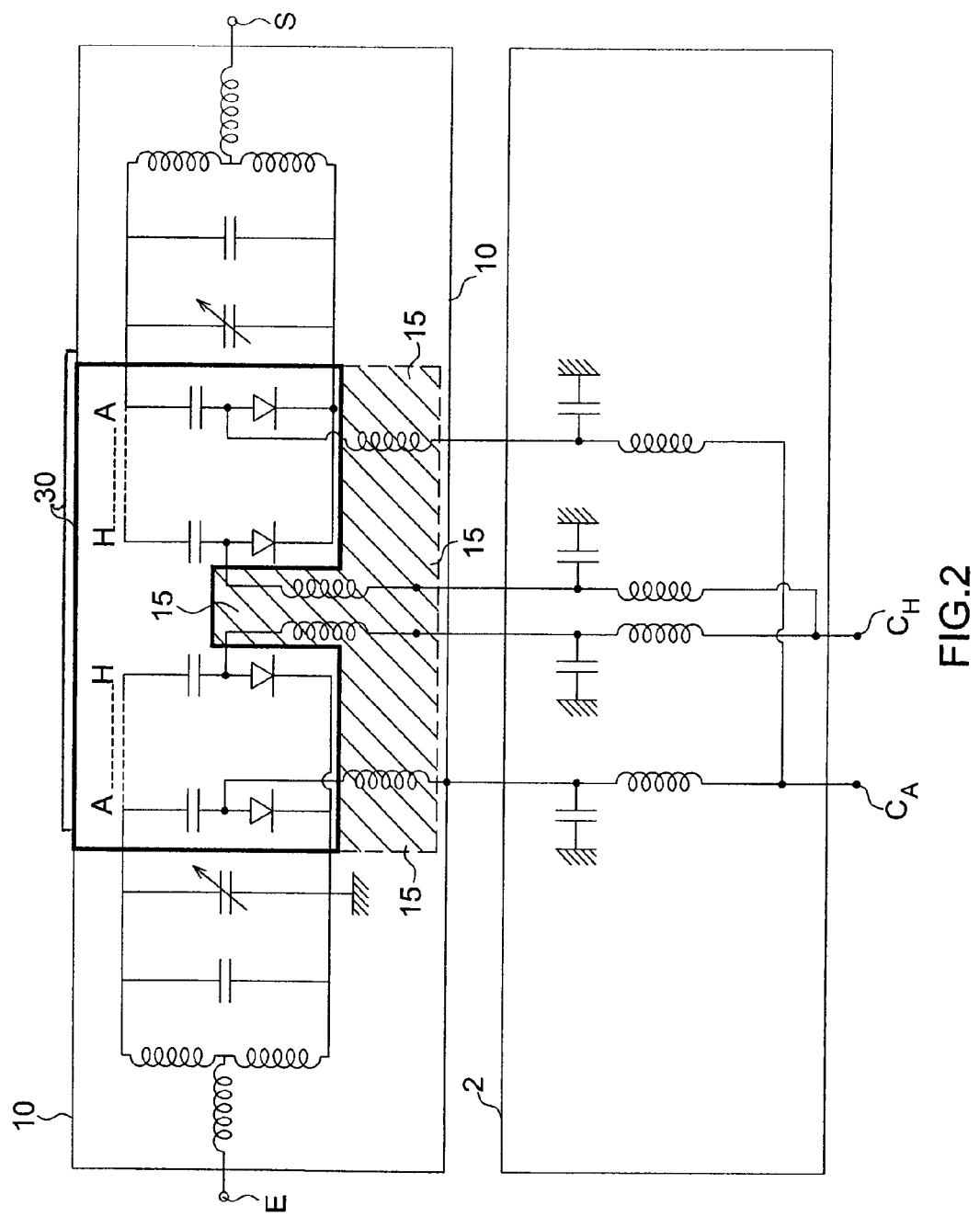
FIG. 2, a circuit diagram of a capacitance-weight filter according to the invention.

FIG. 2 is a circuit diagram showing a capacitance-weight filter according to the invention. The elements that are identical to the elements already presented in the other figures are given the same references. The inventive capacitance-weight filter comprises at least two physically separate boards: a motherboard 10 and a daughterboard 30. The management and control board 2 can either have its functions incorporated on the motherboard 10 or constitute a third board physically separate from the other two. The management and control board 2 comprises all the elements involved in the control and servocontrol functions of the capacitance weights A . . . H. The daughterboard 30 comprises all the elements involved in the tractable filtering, that is, in particular, the capacitance weights A . . . H. The daughterboard 30 comprises no inductive element necessary for the electromagnetic coupling. The daughterboard 30 retains the symmetry of the elements involved in the tractable filtering. The motherboard 10 comprises all the oscillating circuits. The interface between the motherboard 10 and the daughterboard 30 is implemented by a connector 31 and wiring for the radiofrequency signals 32 (represented in FIG. 3). The connector 31 makes it possible in particular to convey the commands from the management and control board 2 to the daughterboard 30, the motherboard 10 ensuring the routing of the signals to the connector 31. The wiring 32 makes it possible to convey to the daughterboard 30 the radiofrequency signals received on the input E of the motherboard 10, and, reciprocally, makes it possible for the daughterboard 30 to deliver filtered radiofrequency signals to the motherboard 10 which will route them to the output S. The motherboard 10 comprises an area 15 over which are disposed the inductive elements necessary in particular for the electromagnetic coupling of the oscillating circuits included on the daughterboard 30.

Figure 3:
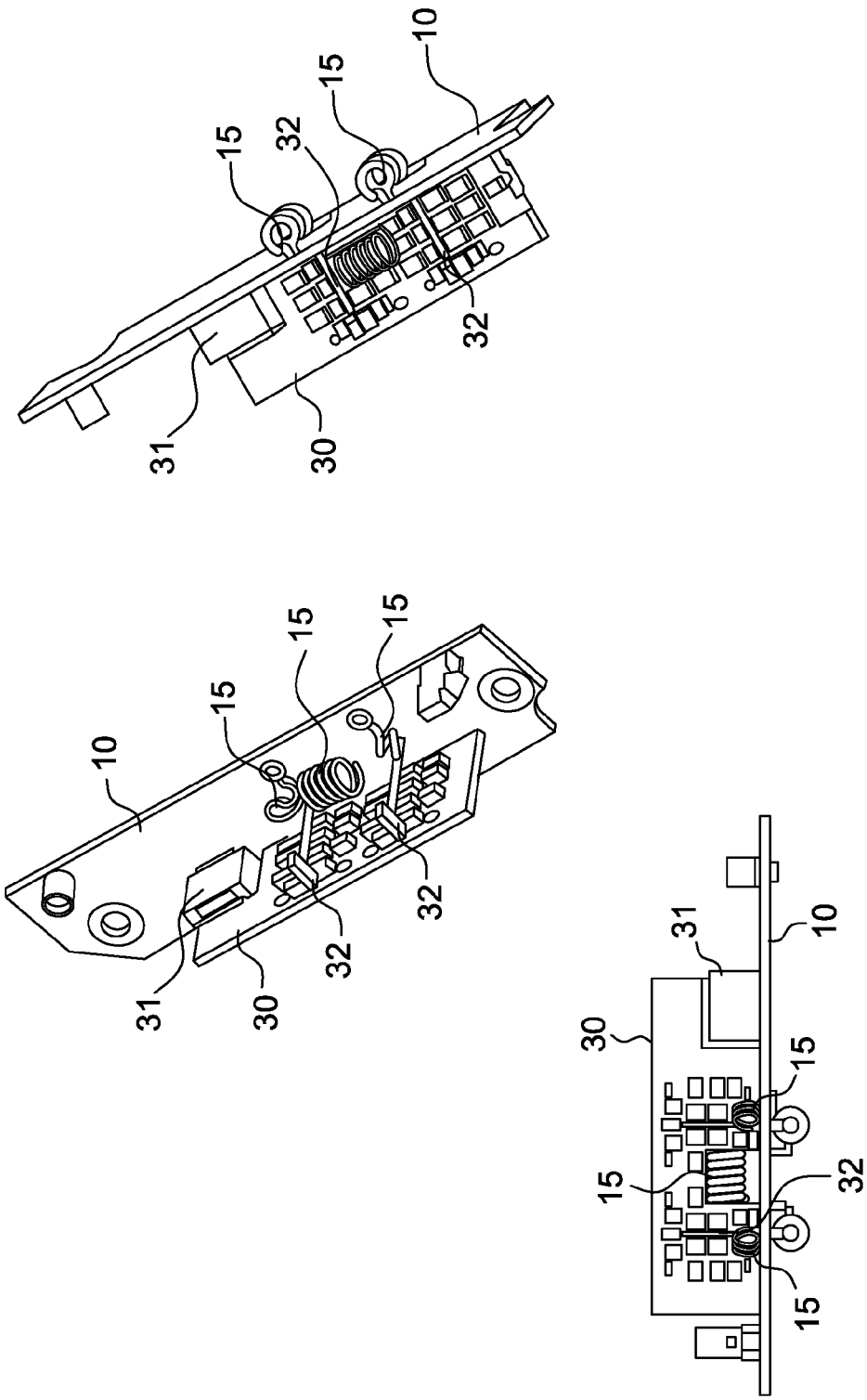
FIG. 3, diagrammatic views of one exemplary embodiment of a capacitance-weight filter according to the invention.

FIG. 3 shows diagrammatic views of one exemplary embodiment of an inventive capacitance-weight filter. The elements identical to those already present in the other figures are given the same references. The daughterboard 30 and the motherboard 10 are boards produced using SMC technology (SMC standing for Surface-Mount Components). The daughterboard 30 can be a double-sided board, making it possible to reduce the area needed for the tractable filter elements. The daughterboard 30 is disposed roughly orthogonal to the motherboard 10. The daughterboard 30 can in particular comprise pins, notches or any other immobilizing element disposed on the bottom part in contact with the motherboard 10, the immobilizing elements being introduced into opposing notches disposed on the motherboard 10.

The connector 31 is an SMC connector. The wiring 32 can be produced in particular by the end of the inductor using tap induction coils. The wiring 32 can also be produced in particular using coaxial cables. Furthermore, series inductors are disposed on the motherboard 10 over the area 15 to ensure the electromagnetic coupling of the oscillating circuits included on the daughterboard 30. This choice makes it possible in particular to simplify the mechanical mounting of the daughterboard 30 on the motherboard 10. The choice of the series inductors also makes it possible to have the filter operate with constant quality Q. In particular, silvered wire air inductors can be used. Thus, the manual wiring of the filter is limited mainly to the soldering of the silvered wire air inductors onto the motherboard 10. The motherboard 10 can also, if necessary, be associated with several daughterboards 30.

In one embodiment, after the daughterboard 30 and the main board have been assembled, a solder bead is applied, thus providing an optimal ground return.

In one embodiment, the two oscillating circuits operate with critical coupling, a characteristic that can be determined in particular from the overvoltage coefficients of the induction coils included in each oscillating circuit.

It will be readily seen by one of ordinary skill in the art that embodiments according to the present invention fulfill many of the advantages set forth above. After reading the foregoing specification, one of ordinary skill will be able to affect various changes, substitutions of equivalents and various other aspects of the invention as broadly disclosed herein. It is therefore intended that the protection granted hereon be limited only by the definition contained in the appended claims and equivalents thereof.

The invention claimed is:

1. A capacitance-weight compact power-agile filter comprising:
    two electromagnetically-coupled oscillating circuits, each of the oscillating circuits having capacitance weights, each of the capacitance weights being controlled by signals, at least one motherboard and at least one daughterboard being physically separate, the at least one daughterboard having the capacitance weights, the at least one motherboard including all of the oscillating circuits.

2. The capacitance-weight compact power-agile filter according to claim 1, wherein an interface between the at least one motherboard and the at least one daughterboard is provided by a connector and a wiring for radiofrequency signals, the connector making it possible to convey commands intended for the capacitance weights, the wiring making it possible to convey to the at least one daughterboard radiofrequency signals received by the at least one motherboard, the wiring making it possible to convey from the at least one daughterboard filtered radiofrequency signals.

3. The capacitance-weight compact power-agile filter according to claim 2, wherein the wiring is produced by an end of an inductor using a tap induction coil.

4. The capacitance-weight compact power-agile filter according to claim 2, wherein the at least one daughterboard, the at least one motherboard and the connector are manufactured using surface-mount component technology.

5. The capacitance-weight compact power-agile filter according to claim 1, wherein series inductors are disposed on the at least one motherboard over an area ensuring magnetic coupling of the oscillating circuits, a capacitive part of which is included on the at least one daughterboard.

6. The capacitance-weight compact power-agile filter according to claim 5, wherein the inductors are silvered wire air inductors.

7. The capacitance-weight compact power-agile filter according to claim 1, wherein the at least one daughterboard is disposed roughly orthogonally to the at least one motherboard.

8. The capacitance-weight compact power-agile filter according to claim 7, wherein the at least one daughterboard comprises immobilizing elements disposed on a bottom part in contact with the at least one motherboard, the immobilizing elements being introduced into opposing notches disposed on the at least one motherboard.

9. The capacitance-weight compact power-agile filter according to claim 1, wherein the at least one daughterboard is a double-sided board.

10. The capacitance-weight compact power-agile filter according to claim 1, wherein the at least one daughterboard comprises a plurality of daughterboards.

* * * * *